United States Patent
Heintzelman et al.

(10) Patent No.: US 10,775,420 B2
(45) Date of Patent: Sep. 15, 2020

(54) NON-CONTACT MULTI-PHASE CABLE SENSOR

(71) Applicant: U.S. Army Research Laboratory ATTN: RDRL-LOC-I, Adelphi, MD (US)

(72) Inventors: Sean M. Heintzelman, Laurel, MD (US); Simon J. Ghionea, North Bend, WA (US); David M. Hull, Adelphi, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 128 days.

(21) Appl. No.: 15/710,894

(22) Filed: Sep. 21, 2017

(65) Prior Publication Data

US 2018/0088159 A1 Mar. 29, 2018

Related U.S. Application Data

(60) Provisional application No. 62/401,656, filed on Sep. 29, 2016.

(51) Int. Cl.
*G01R 21/08* (2006.01)
*H05K 1/18* (2006.01)

(52) U.S. Cl.
CPC ............. *G01R 21/08* (2013.01); *H05K 1/181* (2013.01); *H05K 2201/10151* (2013.01)

(58) Field of Classification Search
CPC .................. G01R 21/08; H05K 1/181; H05K 2201/10151
See application file for complete search history.

(56) References Cited

U.S. PATENT DOCUMENTS

| | | | |
|---|---|---|---|
| 5,726,581 A | 3/1998 | Vranish | |
| 6,975,289 B1 * | 12/2005 | Beeteson | G09G 1/20 345/75.2 |
| 8,560,256 B2 * | 10/2013 | Gu | G01D 4/002 702/116 |
| 9,037,314 B2 * | 5/2015 | Waite | G01C 21/00 701/3 |
| 9,081,041 B2 * | 7/2015 | Friedrich | G01R 15/207 |
| 1,031,007 A1 | 6/2019 | Hull et al. | |
| 2005/0156587 A1 * | 7/2005 | Yakymyshyn | G01R 15/207 324/117 R |
| 2005/0286190 A1 * | 12/2005 | Rostron | G01R 15/142 361/65 |
| 2006/0084397 A1 * | 4/2006 | Turner | G01R 15/18 455/117 |

(Continued)

OTHER PUBLICATIONS

John S. Donnal, and Steven B. Leeb, "Noncontact Power Meter," IEEE Sensors Journal, vol. 15, No. 2, Feb. 2015, 1161.

(Continued)

*Primary Examiner* — Dominic E Hawkins
(74) *Attorney, Agent, or Firm* — Eric B. Compton

(57) ABSTRACT

A system includes at least one electric field sensor and at least one magnetic field sensor, wherein the at least one electric field sensor and the at least one magnetic field sensor are formed as an integrated sensor unit with a single electrical circuit, and wherein the integrated sensor is configured to measure power of an energized cable.

23 Claims, 9 Drawing Sheets

(56) References Cited

U.S. PATENT DOCUMENTS

| | | | | |
|---|---|---|---|---|
| 2008/0284441 | A1* | 11/2008 | Kowalczyk | G01V 3/104 324/334 |
| 2009/0122453 | A1* | 5/2009 | Vicente | H01H 71/7409 361/93.3 |
| 2009/0315555 | A1* | 12/2009 | Heger | G01R 15/148 324/260 |
| 2011/0221429 | A1* | 9/2011 | Tamura | G01R 15/207 324/244 |
| 2012/0187943 | A1* | 7/2012 | Ausserlechner | G01R 33/06 324/244 |
| 2014/0210460 | A1* | 7/2014 | Kuhns | G01R 21/08 324/244 |
| 2014/0320125 | A1* | 10/2014 | Leeb | G01D 5/16 324/252 |
| 2014/0343878 | A1 | 11/2014 | Gudmundsson et al. | |
| 2015/0211760 | A1* | 7/2015 | Wang | F24F 11/30 700/276 |
| 2016/0025666 | A1 | 1/2016 | Ghionea et al. | |
| 2016/0025785 | A1* | 1/2016 | Liu | G01R 25/00 702/66 |
| 2016/0094193 | A1* | 3/2016 | Kris | H03F 3/45475 330/254 |
| 2016/0327597 | A1 | 11/2016 | Ghionea et al. | |
| 2016/0344320 | A1* | 11/2016 | Sun | H02P 6/16 |
| 2017/0102417 | A1* | 4/2017 | Juan | G01R 21/1331 |

OTHER PUBLICATIONS

Sean M. Heintzelman, ARL-TR-7507, "Non-Contact Circuit for Real-Time Electric and Magnetic Field Measurements," U.S. Army Research Laboratory, dated Oct. 2015.

Sean M. Heintzelman and David M. Hull, "Characterization and Analysis of Electric field Sensors," 2015 IEEE IAS Conference, Dallas, Texas, Oct. 18-22, 2015, presented Oct. 20, 2015.

David Lawrence, "Hardware and Software Architecture for Non-Contact, Non-Intrusive Load Monitoring," Master's Thesis, Massachusetts Institute of Technology (reportedly "Submitted Jan. 19, 2016;" presently available on-line, out first date of publication unknown).

David Lawrence, John S. Donnal, and Steven Leeb, "Current and Voltage Reconstruction From Non-Contact Field Measurements," IEEE Sensors Journal, vol. 16, No. 15, Aug. 1, 2016, 6095.

Adam Stone, "Measuring Power New initiative breaks ground in alternative energy technology," C4ISRNET, vol. 16, No. 4, May 2017, p. 22.

"How the Sense Home Energy Monitor Works—Sense Blog," https://blog.sense.com/how-the-sense-home-energy-monitor-works/, sense.com, (c) 2017.

* cited by examiner

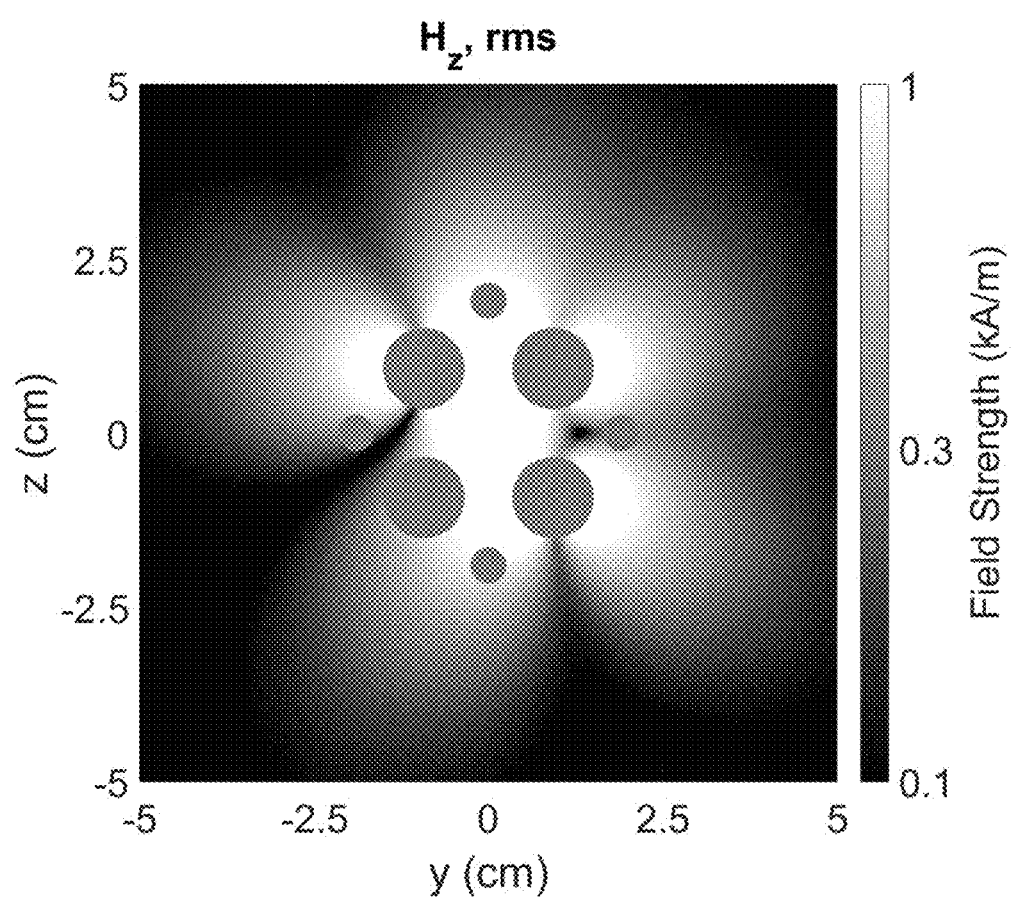

NON-CONTACT MULTI-PHASE CABLE SENSOR

CROSS REFERENCE TO RELATED APPLICATION

This application claims the benefit of U.S. Provisional Patent Application No. 62/401,656 filed on Sep. 29, 2016, the contents of which, in its entirety, is herein incorporated by reference.

GOVERNMENT INTEREST

The embodiments herein may be manufactured, used, and/or licensed by or for the United States Government without the payment of royalties thereon.

BACKGROUND

Technical Field

The embodiments herein generally relate to power usage monitoring, and more particularly to devices used for monitoring power usage in electrical devices.

Description of the Related Art

There are a number of devices for monitoring power usage. In general, these conventional devices require disabling power to the cable and using an electrician for proper installation (physical attachments) of voltage and current probes. An energized electric power cable generates low-frequency electric and magnetic fields that are related to the voltages and currents. Especially at wavelengths $\lambda \gg d$, where d is the distance away from an energized conductor and $\lambda$ is the signal wavelength, one may extract electrical information, such as voltage and current on each phase, with (near-field) electric and magnetic field theory and the Principle of Superposition.

Coulomb's and Biot-Savart's Laws, respectively, relate the electric and magnetic fields to the voltage V and current I on a single straight energized wire:

$$\bar{E} = \frac{\rho(V)}{\varepsilon_0 2\pi d} \hat{a}_r \quad (1)$$

$$\bar{B} = \frac{\mu_0 I}{2\pi d} \hat{a}_\varphi \quad (2)$$

where $\mu_0$ and $\varepsilon_0$ are magnetic permeability and electric permittivity constants, $\rho$ is the surface charge density on the wire, and $a_\varphi$ and $a_r$ are vectors pointing in the direction of the field in cylindrical coordinates. Superposition principles are used with Coulomb's and Biot-Savart's Laws in multi-wire configurations (i.e., 3-phase power cables). The boundary element method or electromagnetic models are typically used to solve for $\rho(V)$.

SUMMARY

In view of the foregoing, an embodiment herein provides a system comprising at least one electric field sensor, and at least one magnetic field sensor, wherein the at least one electric field sensor and the at least one magnetic field sensor are formed as an integrated sensor unit with a single electrical circuit, and wherein the integrated sensor is configured to measure power of an energized cable.

The integrated sensor may be configured to measure power on any of a 1-, 2-, and 3-phase power cable. The integrated sensor may be configured to perform simultaneous electric and magnetic field measurements of an energized conductor in the energized cable. The integrated sensor may adjust its own variable gain and variable offset based on a type of cable for which power is being measured. The integrated sensor may receive a DC single-ended voltage supply to power the integrated sensor. The electrical circuit may be formed on a printed circuit board (PCB). The at least one electric field sensor and the at least one magnetic field sensor may be formed on a same side of the PCB. The at least one electric field sensor may comprise an electric field transducer comprising an isolated conducting component (e.g., foil section) on the PCB, on the layer closest to the power cable.

The electric-field transducer may comprise any of a guard and a shield. The at least one electric field sensor may comprise a charge induction electric-field sensor. The charge induction electric-field sensor may be integrated into the PCB, and may include a guard (or driven shield) to minimize the effects of capacitive coupling to the rest of the PCB circuitry, and/or a shield to reduce the sensitivity to unwanted fields; e.g., originating away from the power cable being monitored.

The integrated sensor may be adjacent to the energized cable, and may be held in place with a cable tie or other fastener (e.g., Velcro® fasteners, etc.). The at least one magnetic field sensor may comprise multiple magnetic field sensors. The multiple magnetic field sensors may be configured to be arranged in a line across the energized cable. The at least one electric field sensor may be spaced apart from the at least one magnetic field sensor. The integrated sensor may be configured to measure voltage and current magnitudes and phases in real time for each conductor in the energized cable. The system may further comprise a signal conditioning module comprising a microcontroller, a digital-to-analog converter (DAC) operatively connected to the microcontroller, a variable gain circuit operatively connected to the DAC, and a differential operational amplifier operatively connected to the microcontroller, the DAC, and the variable gain circuit, wherein the at least one electric field sensor, the at least one magnetic field sensor, and the signal conditioning module are formed as an integrated sensor unit with a single electrical circuit.

The microcontroller may be configured to act as a master of the at least one electric field sensor and at least one magnetic field sensor. The integrated sensor may be operatively connected to the variable gain circuit. The system may further comprise a processor configured to program the integrated sensor through the microcontroller. The processor and the microcontroller may be one device.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 7B is a plot showing the vertical ($H_z$) components of the magnetic field around an example three-phase power cable according to an embodiment herein.

DETAILED DESCRIPTION

Figure 1:
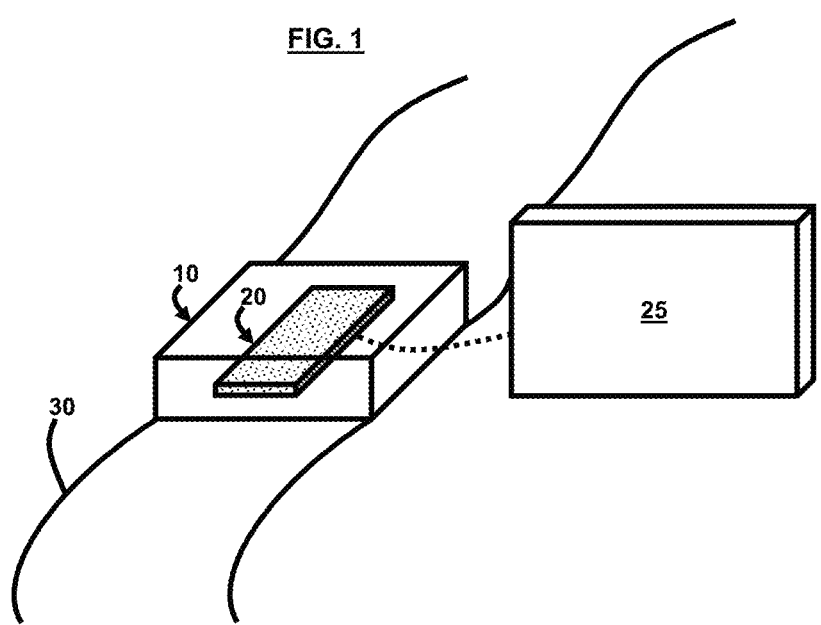
FIG. 1 is a schematic diagram of a sensor system according to an embodiment herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein provide for the integration of electric and magnetic field sensors for measuring power on 1-, 2-, or 3-phase power cables. Referring now to the drawings, and more particularly to FIGS. 1 through 8, where similar reference characters denote corresponding features consistently throughout the figures, there are shown exemplary embodiments.

As shown in FIG. 1, the embodiments herein provide a non-contact cable sensor system (hereinafter "sensor 10"). The sensor 10 may include a PCB 20 with electric- and magnetic-field sensors placed near the outer surface of a multi-conductor cable 30 and communicatively coupled to a processor 25. The sensor 10 provides for a multi-channel sensor for simultaneous, real-time measurement of electric and magnetic fields near the surface of the power cables 30. The power cables 30 may be energized 1-, 2-, or 3-phase cables, in example embodiments. Hall-effect sensors may be used to detect DC magnetic fields (associated with DC electric currents); however, Hall-effect sensors may also be used to detect AC fields (typically 50/60 Hz and harmonics).

Figure 2:
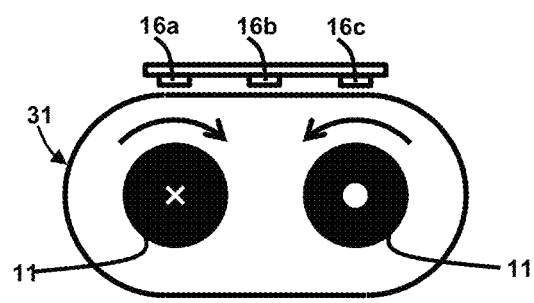
FIG. 2 is a schematic diagram of a split-phase power cable according to an embodiment herein.

In a single-phase power cable 30, the measured magnetic field is linear and in phase with the current. In a split-phase (e.g., 120/1240-V, sometimes called 2-phase) 31, as illustrated in FIG. 2, the measured field is the superposition of the constituent fields from each conductor. In this case, multiple sensors are used to sense the combined field at several different locations and or orientations. Accordingly, in the split-phase (120/240-V) cable 31 shown in FIG. 2 (with reference to FIG. 1), which is typical of a 200-A home service entrance cable, three magnetic sensors 16a-16c are used to estimate the currents in the two conductors 11 (or two power conductors and a neutral).

Figure 3:
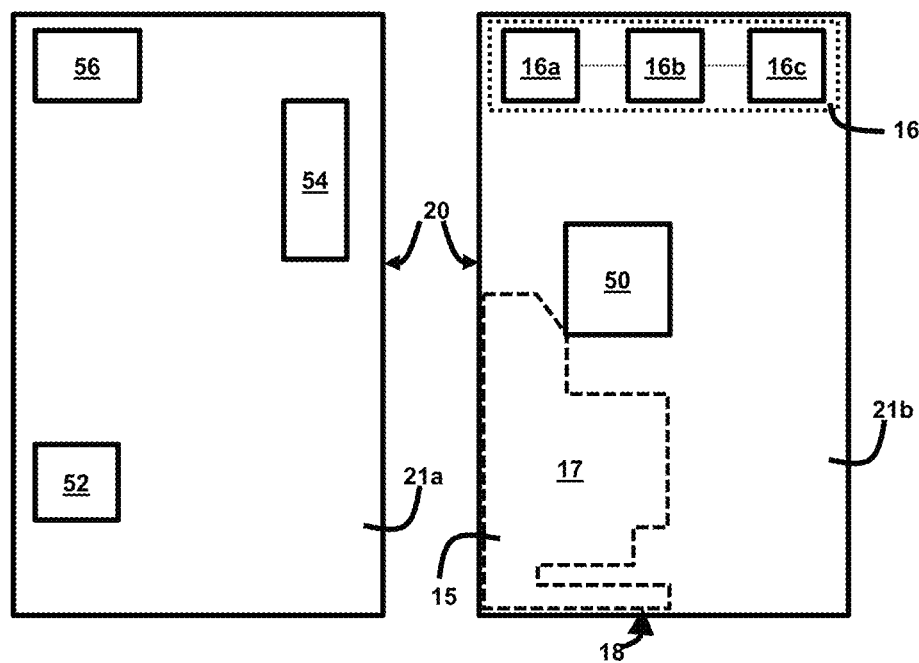
FIG. 3 is a schematic diagram of a printed circuit board with several magnetic-field sensors and an electric-field sensor according to an embodiment herein.

As shown in FIG. 3, with reference to FIGS. 1 and 2, electric and magnetic field sensors 15, 16 are integrated into a PCB 20; i.e., one conductor part of a PCB 20. FIG. 3 shows the PCB 20 with several magnetic-field sensors 16a-16c and an electric-field sensor (e.g., sensing electrode 17). The sensors 16a-16c may be positioned on the bottom side 21b, nearest the placement of the cable 30 (not shown in FIG. 3). To condition sensor outputs, a current preamp (e.g., a variable offset circuit 56 and associated passive components) may be located on the top side 21a of the PCB 20 as well as the voltage amplifier (e.g., variable gain circuit 54) and analog-tri-digital converter (ADC) 52. A microcontroller 50 may also be placed on the top side 21a of the PCB 20. However, the specific layout may be adjusted to minimize PCB area, separate analog and digital grounds, and other design and/or manufacturing considerations. In the example embodiment shown in FIG. 3, the microcontroller 50 may be used only for gain control and other "smart sensing" functions. These functions may be eliminated or may perform additional processing tasks. Alternately, the analog signal may be routed to a separate processor board (e.g., processor 25 in FIG. 1), or the sensor 16 may use analog signal processing. In another example, the processor 25 and microcontroller 50 may be one in the same; e.g., the same device with dual functionality. In such an example, the processing and calibration may occur integral to the cable sensor 10 and may transmit pre-configured or filtered processed monitoring or calibration events wirelessly. For example, the sensor 10 may provide information pertaining to wireless transmission and total power consumption, among other features. In another example, the sensor 10 may be configured as a battery-powered device.

The PCB 20 shown in FIG. 3 does not show other active and passive circuit features commonly associated with printed circuit boards so as not to unnecessarily obscure the features associated with the embodiments herein. Many of these circuit features are standard components in printed circuit board technology and those skilled in the art would readily understand how and where such features would be configured on the PCB 20.

The PCB 20 may preferably communicate with 1-Wire and Serial Peripheral Interface (SPI) protocols through a microcontroller 50 communicating with a processor 25 (shown in FIG. 1) or other processing device, to obtain ideal sensor characteristics from the user through a Transducer Electronic Data Sheet (TEDS) compliant (IEEE std. 1451) interface. The 1-Wire protocol is a digital communication standard that allows several devices to communicate over a single electrical connection (not including ground). The 1-Wire protocol may be utilized to communicate digital information about each transducer in a TEDS compliant manner during sensor initialization, thereby providing a "smart sensor" capability. Additionally, the 1-Wire protocol may be implemented with software in the microcontroller 50 that also performs other "smart sensing" functions, Which saves power and board space, and keeps the component count and cost down. In accordance with an embodiment herein, the processor 25 records the sensor outputs, and communicates with other devices and end users, typically via a network. In various examples, the processor 25 may be a personal computer running MATLAB® software, for example, in a laboratory environment, or the processor 25 may be a low-power microcontroller or a field-programmable gate array (FPGA) running embedded code in an operational environment. Other implementations of the processor 25 are also possible in accordance with the embodiments herein. The PCB 20 automatically adjusts sensor gains and offsets based on the type of cable 30 and user parameters, which maximizes dynamic range autonomously. The sensor 10 may be used with a calibration procedure that allows original current and voltage information to be extracted. Many possible calibration methods exist and may be used in accordance with the embodiments herein.

In contrast to conventional devices, the sensor 10 provided by the embodiments herein may be adjacent to the cable 30 such that the sensor 10 may be placed near or in contact with (e.g., "clipped" or "strapped" onto) the outside of an insulated cable 30 in order to monitor overall power usage. For example, the clipping or strapping may occur using a flexible strap with hook and loop-type fasteners such as Velcro® fasteners, or using electrical tape or other electrical adhesive wrapped around the sensor 10 and cable 30, Additionally, the sensor 10 may be permanently fixed to the insulated cable 30. The sensor 10 does not require power to be shut-off by an electrician for installation. Accordingly, the embodiments herein provide for a non-invasive, non-interruptive technique, which may be readily installed or moved by a user.

The sensor 10 comprises one or more electric field sensors 15 and one or more magnetic field sensors 16 integrated on a PCB 20, with signal conditioning processes also on the PCB 20. The magnetic field sensors 16 may be configured as Hall-Effect (B field) sensors 16a-16c that monitor the varying currents on the cable 30, where N magnetic sensor outputs are used to estimate up to N line currents. The one or more magnetic field sensors 16 may measure the magnetic field at N locations. Both types of sensors 15, 16 are integrated directly on the single PCB 20.

The example embodiment shown in FIG. 3 provides a single cable sensor 10 with three Hall-effect sensors 16a-16c and one E-field sensor 15 to detect two-line currents and one neutral current in a typical 200-A, 120/240-V split-phase home power cable. While the examples herein describe Hall-effect sensors, the embodiments herein are not restricted to these types of sensors. Other example sensors which may be utilized include magneto-resistive (MR) sensors, including anisotropic magneto-resistive (AMR), giant magneto-resistive (GMR), tunnel magneto-resistive (TMR), colossal magneto-resistive (CMR), and extraordinary magneto-resistive (EMR) sensors. Other chip-scale sensors, including small coil-based sensors, fluxgates, or other types of magnetometers, may also be used. The embodiments herein provide for using two of these cable sensors to detect 3-phase currents in a 3-phase power cable.

Figure 4:
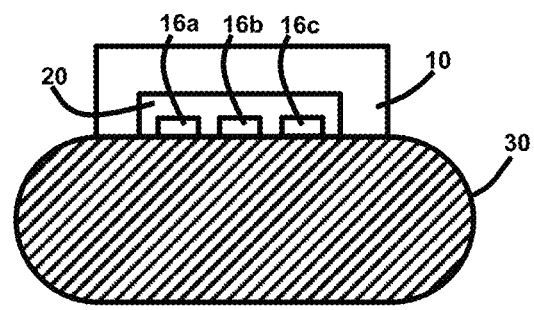
FIG. 4 is a schematic diagram illustrating an example implementation of a sensor system using a split-phase (120/240-V) power cable according to an embodiment herein.

As mentioned, the magnetic field may be measured by a Hall-Effect (B-field) sensor 16, in an example. In one embodiment, as shown in FIG. 4, with reference to FIGS. 1 through 3, three one-dimensional Hall-Effect sensors 16a-16c are arranged in a line across an energized power cable 30 to measure the magnetic field at three spatially diverse locations. In the example sensor system implementation shown in FIG. 4, the three magnetic sensors 16a-16c are positioned transverse to the power cable 30 being sensed. If the power conductors are oriented generally parallel to the cable (as is normally the case in conventional systems), then the sensed field at each of the three sensor locations is essentially the same at power frequencies. Accordingly, the three sensors 16a-16c are positioned transverse to the power cable 30 (or around the cable 30 in another example), where the fields in a multi-conductor cable are expected to vary. In an example, these sensors 16a-16c may provide an accurate measurement of a ±10 mT magnetic field in the azimuthal direction. The output voltage of the magnetic sensor 16 is linear with a magnetic field strength up to a maximum chip output of 50-mV amplitude, for example. Accordingly, the magnetic sensitivity Ω for the sensor may be calculated as:

$$\Omega = \frac{V_{out}}{B} = 5\frac{V}{T} \quad (3)$$

In the embodiment shown in FIG. 3, there may be one electric field sensor 15 and three magnetic field sensors 16a-16c located on the bottom side 21b of the PCB 20. The electric field (or E-field) sensor 15 is used to monitor the voltage on a voltage-regulated power system (meaning the phase and magnitude of the voltage waveform are nearly constant). In an example, the electric field sensor 15 may be configured as a charge induction electric-field sensor.

Figure 5:
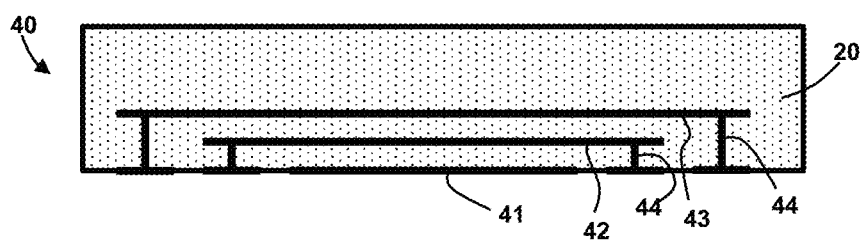
FIG. 5 is a schematic diagram illustrating a a charge induction electric-field electrode protected by a guard and a shield.

In one example shown in FIG. 5, with reference to FIGS. 1 through 4, the transducer electrode 41 may be configured as a patch of copper or other conductive material on the bottom layer of the PCB 20. Surrounding this is a guard 42, which is driven at the electrode potential with a feedback circuit. In this way, no charge is induced on the electrode 41 by the surrounding circuitry: Δq=C*ΔV=(C)(0)=0. Surrounding this is a shield 43, which is held at (AC) ground. In this way, the shield 43 will zero out the electric field inside, and all induced charges (and currents) due to the shield-to-guard capacitance will end up on the guard 42, where they are not added to the charges/currents on the sense electrode 41.

The guard 42 and shield 43 span multiple layers of the PCB 20 with conducting vias 44. Many vias 44 may be used to help shield the sides of the electrode 41. However, as a rule of thumb, good shielding may be obtained by making the width of the copper traces several times the distance between the PCB layers, and only a single via may be necessary to connect the parts of the guard 42 or shield 43 on each layer together.

In an embodiment, the driven guard 42 and shield 43 are used to create a passive E-field transducer 40 with desired directional sensitivity (i.e., toward the power cable), while minimizing the external (clutter) E-field from other sources. Moreover, by constructing the electrode 41, guard 42, and shield 43 out of conducting copper in three layers of a multi-layer PCB 20, the cost of the electrode 40 is minimized.

The output current from the charge induction electric-field sensing electrode 17 is proportional to the derivative of the external E-field, as given by:

$$i_{out} = \frac{dQ}{dt} = \varepsilon A_{eff} \frac{dB_Z}{dt} = \omega \varepsilon A_{eff} E_{z0} \sin(\omega t + \varphi) \quad (4)$$

where ε is the free space permittivity, ω is frequency, φ is the E-field phase, $E_{z0}$ is the amplitude of the electric field, and $A_{eff}$ is the effective area of the charge induction electric-field sensing electrode 17. The effective area is the physical area of region 18, multiplied by an enhancement factor that is determined by the geometry of the sensor. For flat electrodes, this enhancement factor may be approximately one, in one example. The current of the charge induction electric-field sensing electrode 17 is fed into a transimpedance amplifier (not shown) with a gain of 1 V/mA. The final output of the charge induction electric-field sensing electrode 17 is:

$$V_{out}=1000 i_{out}=\beta\omega E_{z0}\sin(\omega t+\varphi) \quad (5)$$

where $i_{out}$ is used from Eq. (4) and a constant $\beta$ is introduced as being equal to $1000\varepsilon A_{eff}$, which represents a frequency-independent transducer gain. This generates a relationship constant for reverse-calculating the electric field E (neglecting phase differences):

$$\beta(\omega) = \frac{V_{out}}{E} \quad (6)$$

where $\beta$ is presented in physically-meaningful units.

Figure 6:
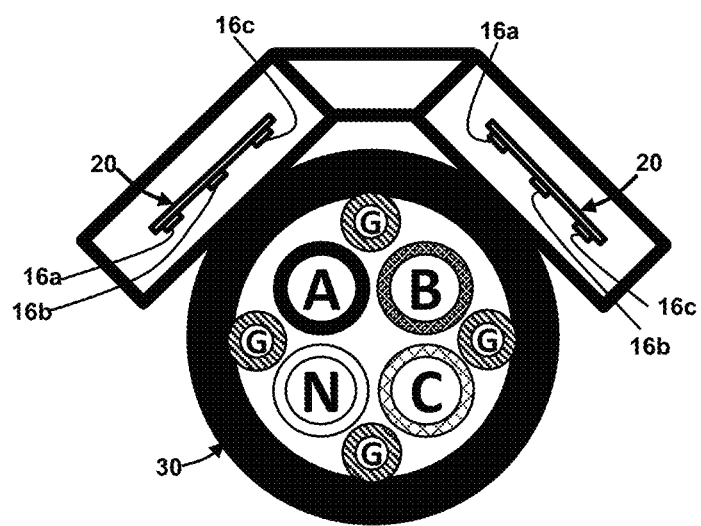
FIG. 6 is a schematic diagram illustrating yet another example implementation of a sensor system using a three-phase (120/208-V) NATO power cable according to an embodiment herein.

The number and relative position of the sensors 15, 16a-16c are selectively chosen to maximize the signal diversity when placed over a typical 120/240-V split-phase power cable that may be used to provide 200-A utility service to a typical home. Other number and configuration of these transducers are possible for other specific scenarios. For example, as shown in FIG. 6 (with reference to FIGS. 1 through 5), using two PCBs 20 (with a total of six H-field and 2 E-field transducers), a cable sensor to a 3-phase (120/208-V, 200-A) military power cable 32 may be realized. As such, in the 3-phase (120/208-V) cable typically used with 60-kW military generators, two sets of three magnetic sensors 16a-16c are used to measure the field at additional points "around" the cable 32, and to better estimate the three phase currents.

Figure 7A:
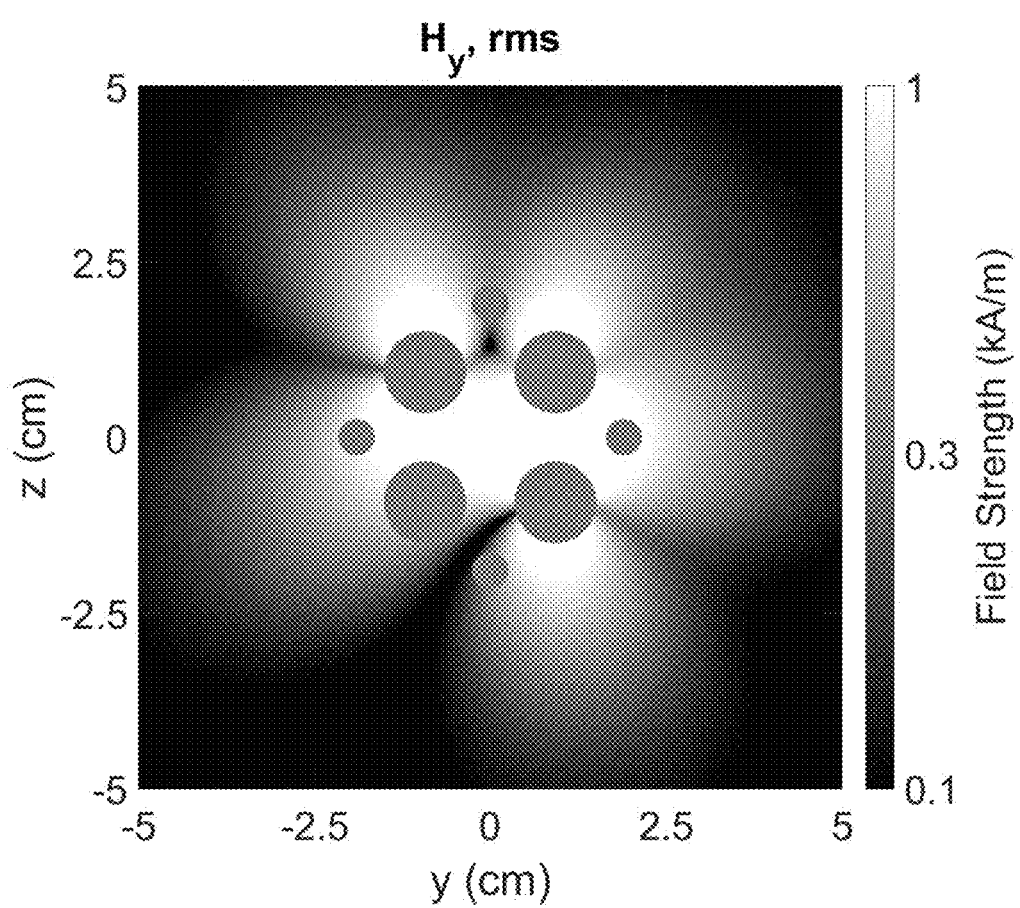
FIG. 7A is a plot showing the horizontal ($H_y$) components of the magnetic field around an example three-phase power cable according to an embodiment herein.

FIGS. 7A and 7B, with reference to FIGS. 1 through 6, are plots showing the horizontal ($H_y$) and vertical ($H_z$) components of the magnetic field around an example three-phase power cable according to an embodiment herein. In the plots of FIGS. 7A and 7B, three of the larger conductors (top two and bottom right) are energized to an rms voltage of 120 V, and are 120 degrees out of phase with each other. Each of these conductors carries 100 A rms, in phase with their respective voltages. The bottom left conductor and the four remaining conductors are grounded and carry no current. The strength and direction of the magnetic field vary significantly around the cable, and may be measured at multiple locations to more accurately measure the power flow in the cable.

Other implementations include using pairs of cable sensors on 480-V, 3-phase power cables. The arrangement of E-field sensors 15 and B-field sensors 16a-16c around a multi-conductor cable 32 enables the transducers to have good spatial diversity relative to the conductors. In general, this provides good mathematical diversity of the resulting signals, which may provide more accurate estimation of conductor power after a calibration procedure.

Figure 8:
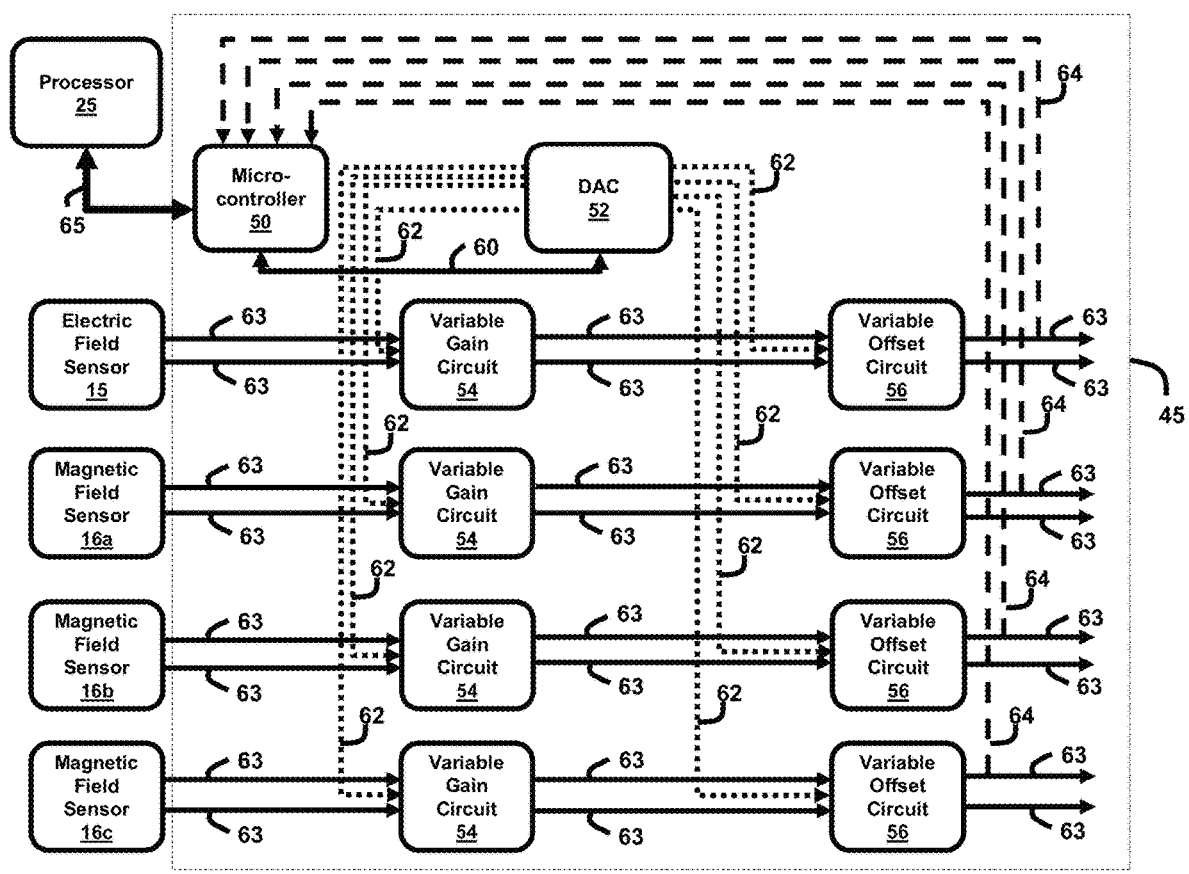
FIG. 8 is a system block diagram according to an embodiment herein.

The sensor 10 adjusts itself on start-up based on the type of cable 30 to increase the usable dynamic range and linearity of its output. The sensor 10 uses a signal conditioning module 45 comprising a microcontroller 50, digital-to-analog converter (DAC) 52, variable gain circuit 54, and variable offset circuit (e.g., an operational amplifier (op-amp)) 56, with the DAC 52, variable gain circuit 54, and variable offset circuit 56 configured on the top layer 21a of the PCB 20. In one embodiment, the DAC 52 comprises an 8-channel DAC. The connections of sensors 15, 16a-16c to the signal conditioning module 45 are shown in FIG. 8, with reference to FIGS. 1 through 7B. FIG. 8 shows four transducers that are managed over a single 1-Wire interface 65. The sensor 10 optimizes its own gain voltage and offset voltage using the signal conditioning module 45 in the following manner: (1) The microcontroller 50 reads ferro-electric random-access memory (FRAM) (not shown) for current DAC outputs on the eight channels of the DAC 52. (2) The microcontroller 50 changes the digital value for one of eight DAC channels through the SN bus 60. (3) The DAC 52 sets the corresponding analog output voltage to a desired variable circuit input 62. (4) The variable gain circuit 54 and/or variable offset circuit 56 outputs changes 63. (5) The output signal 64 is measured by the analog-to-digital converters (ADCs) (not shown) of the microcontroller 50. Based on the ADC measurement the microcontroller 50 increases or decreases the DAC 52 setting (then repeats steps 1-5 above), or keeps the DAC 52 setting and stores the setting in FRAM. This automatic gain control (AGC) feature is particularly useful with 10-12 bit ADCs, which are available at lower power and cost than 16-24-bit ADCs, and are often included in microcontroller chips. In this way, the sensor 10 may adapt to a wide variety of power cables 30, without the need to use a high-performance ADC.

The differential output currents of all the magnetic field sensors (e.g., Hall-Effect sensors) 16a-16c and the electric field sensor (e.g., charge induction electric-field sensor) 15 are operatively connected to the variable gain circuit 54, wherein the variable gain circuit 54 may change the gain magnitude across an 80-dB (1-10000 times) range depending on a supplied gain voltage $V_g$. This may provide a total operating range up to 140 dB, even with a 10-12 bit ADC with only approximately 60 dB of instantaneous dynamic range. The variable gain circuit 54 and associated resistors (not shown) and capacitors (not shown) constitute a variable gain circuit.

The DC offset of the output signal 64 is slightly dependent on both the input DC offset and $V_g$, so one may ensure a DC offset at 1.65 V, for example, with the variable offset circuit 56 immediately following the variable gain circuit 54. The variable offset circuit 56 common-mode voltage ($V_{CM}$) pin(s) (not shown) are connected to different channels on the DAC 52. Accordingly, the voltage may be varied on each of the $V_{CM}$ pins, thereby varying the DC offset of the variable offset circuit 56 output. The variable offset circuit 56 and associated capacitors (not shown) constitute a variable offset circuit. The microcontroller 50 acts as the master for the SPI 60 and 1-Wire devices on the electric field sensor 15 and magnetic field sensor 16, but as a slave 1-Wire device for a 1-Wire compatible processor 25.

The individual sensor gains are automatically adjusted on demand by the processor 25 to maintain a high Signal-to-Noise Ratio (SNR) for optimal performance. The sensor 10 may be turned on with a DC voltage (e.g., DC+3.3V single-ended supply). The embodiments herein are not restricted to a DC+3.3 V single-ended supply. With a calibration procedure, the voltage and current magnitudes and phases may then be extracted in real time for each conductor in the cable 30.

Generally, the sensor 10 provides for an integration of electric and magnetic field sensors 15, 16 into a PCB 20 for performing voltage and current measurements on multi-conductor cables 30 without "tapping" any of the wires. In use, the bottom of the sensor 10 may be placed near (or attached to) the outside of a multi-conductor energized power cable 30, such as a service-entrance power cable to a building.

In one embodiment, the sensor 10 may be configured as a 1.25"×2" sensor unit PCB 20, for example, for simultaneous electric and magnetic field measurements of an energized conductor in the cable 30. The sensor 10 adjusts its own output characteristics (gain, offset) on start-up dependent on the type of cable 30 to which the sensor 10 is attached. In this way, the sensor 10 may be used to estimate voltage and current; however, the cable sensor 10 provided by the embodiments herein does not require power outages or other special safety regulations for installation. Sensor calibration parameters, output gain, output DC offset, and device ID information may readily be extracted or altered by any 1-Wire or SPI master device as long as a +3.3V supply is provided for the sensor 10.

The sensor 10 provided by the embodiments herein may be used for mobile power monitoring and energy auditing. The sensor 10 allows voltage and current monitoring without service outage and electrician. For example, the sensor 10 allows for externally monitoring of residential homes without permits or electricians for installation, mobile power monitoring for tactical microgrids, etc. The embodiments herein allow for measuring power on multi-conductor cables 30, extracting current and voltage information for load detection, non-invasive monitoring of data across communications lines, and monitoring device health of systems and loads. In some embodiments, one or more sensors 10 may be used as an electromagnetic field acquisition module or processor as described in U.S. patent application Ser. No. 14/274,259 filed May 9, 2014 and entitled, "Method and Apparatus for Power Quality and Synchrophasor Monitoring on Power Lines," the complete disclosure of which, in its entirety, is herein incorporated by reference.

The foregoing description of the specific embodiments will so fully reveal the general nature of the embodiments herein that others may, by applying current knowledge, readily modify and adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein may be practiced with modification within the spirit and scope of the appended claims.

What is claimed is:

1. A system for measuring power in an energized cable, the system comprising:
    a printed circuit board (PCB);
    at least one electric field sensor;
    at least three magnetic field sensors spaced in a direction transverse to the energized cable measured; and
    a processor, which receives measurement data from said sensors, and is configured to measure power on 1-, 2-, and 3-phase power cables,
    wherein said at least one electric field sensor and said at least three magnetic field sensors are formed as an integrated sensor unit with a single electrical circuit on the PCB.

2. The system of claim 1, wherein said processor is configured to perform simultaneous electric and magnetic field measurements of an energized conductor in said energized cable.

3. The system of claim 1, wherein said processor is configured to automatically adjust its own variable gain and variable offset based on a type of phased power cable being measured.

4. The system of claim 1, wherein said integrated sensor receives a DC single-ended voltage supply to power said integrated sensor.

5. The system of claim 1, wherein said at least one electric field sensor and said at least three magnetic field sensors are formed on the same side of said PCB.

6. The system of claim 1, wherein said at least three magnetic field sensors are arranged in a line which is transverse to said energized cable measured.

7. The system of claim 1, wherein said at least one electric field sensor is spaced apart from said at least three magnetic field sensors.

8. The system of claim 1, wherein said processor is configured to measure voltage and current magnitudes and phases in real time for each conductor in said energized cable.

9. The system of claim 1, wherein said at least one electric field sensor and said at least three magnetic field sensors are integrated within the PCB.

10. The system of claim 1, further comprising means for attaching the system to a power cable.

11. The system of claim 10, wherein the cable attaching means comprise a clip, a strap, a fastener, a tape, and/or an adhesive.

12. The system of claim 1, wherein said processor is a part of the integrated sensor unit or communicates therewith.

13. A sensor system comprising:
    a housing holding two systems for measuring power in an energized cable according to claim 1,
    wherein the housing is configured to position each of two systems adjacent to the energized cable measured.

14. A system for measuring power in an energized cable, the system comprising:
    a printed circuit board (PCB);
    at least one electric field sensor formed as an isolated sensor unit with a single electrical circuit integrated into the PCB comprising:
        an electric-field transducer;
        a guard surrounding the electric-field transducer which is driven at the same voltage as said electric field transducer; and
        a shield surrounding the guard which is passively connected to ground,
        wherein said isolated sensor unit is configured to measure power of the energized cable.

15. The system of claim 14, wherein said at least one electric field sensor comprises a charge induction electric-field sensor.

16. The system of claim 14, wherein the electric-field transducer comprises a patch of copper or other conductive material.

17. The system of claim 14, wherein the electric-field transducer, the guard and the shield span multiple layers of the PCB with conducting vias.

18. A system for measuring power in an energized cable, the system comprising:
    a printed circuit board (PCB);
    one or more sensors for measuring an electric or magnetic field formed as an integrated sensor unit with a single electrical circuit on the PCB and configured to measure power of the energized cable; and a signal conditioning module comprising:
- a microcontroller;
- a digital-to-analog converter (DAC) operatively connected to said microcontroller;
- connected to each of the one or more sensors of the system,
  - a variable gain circuit operatively connected to said DAC and that sensor; and
  - a differential operational amplifier operatively connected to said microcontroller, said DAC, and said variable gain circuit, which controls the variable gain circuit; and
- an automatic gain control (AGC) operatively connected to the microprocessor and the variable gain circuit and differential operational amplifier for each of the one or more sensors, said AGC comprising feedback from the one or more sensors output to the microprocessor,
- wherein the outputs of the differential operational amplifiers for each of the one or more sensors are repeatedly measured by the microcontroller, and in response, the microcontroller adjusts the DAC to provide adjusted signals to the variable gain circuit and the differential operational amplifier for each of the one or more sensors individually so that the gain of each of the one or more sensors is automatically adjusted for the particular type of power cable being measured.

19. The system of claim 18, wherein said microcontroller is configured to act as a master of said one or more sensors.

20. The system of claim 18, further comprising a processor configured to program said integrated sensor through said microcontroller.

21. The system of claim 20, wherein said processor and said microcontroller are one device.

22. The system of claim 20, wherein processor communicates with the microcontroller through an IEEE Standard 1451 compliant protocol.

23. The system of claim 18, where the at least one or more sensor comprise one electric field sensor and three magnetic field sensors.

* * * * *